United States Patent
Morishita

(10) Patent No.: US 7,187,037 B2
(45) Date of Patent: Mar. 6, 2007

(54) ESD PROTECTION DEVICES WITH SCR STRUCTURES FOR SEMICONDUCTOR INTEGRATED CIRCUITS

(75) Inventor: Yasuyuki Morishita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 48 days.

(21) Appl. No.: 11/250,508

(22) Filed: Oct. 17, 2005

(65) Prior Publication Data

US 2006/0081935 A1  Apr. 20, 2006

(30) Foreign Application Priority Data

Oct. 18, 2004  (JP) .............................. 2004-302830

(51) Int. Cl.
*H01L 23/62* (2006.01)
(52) U.S. Cl. ........................ 257/355; 257/361; 257/371
(58) Field of Classification Search ................ 257/355, 257/361–362, 370–371
See application file for complete search history.

(56) References Cited

U.S. PATENT DOCUMENTS

| 5,270,565 A | * | 12/1993 | Lee et al. .................... 257/358 |
| 5,895,940 A | * | 4/1999 | Kim ............................ 257/173 |
| 6,545,321 B2 | | 4/2003 | Morishita |
| 6,621,133 B1 | * | 9/2003 | Chen et al. .................. 257/409 |
| 2004/0136127 A1 | | 7/2004 | Kodama et al. |

FOREIGN PATENT DOCUMENTS

JP    2003-203985 A    7/2003

* cited by examiner

*Primary Examiner*—Theresa T. Doan
(74) *Attorney, Agent, or Firm*—Sughrue Mion, PLLC

(57) ABSTRACT

To control the uneven distribution of current density and reduce the area of an ESD protection circuit in an SCR-type ESD protection device. An N-type well 11, and P-type wells 12a and 12b disposed oppositely and adjacent to the N-type well 11, with the N-type well 11 interposed between them, are formed on the surface of a semiconductor substrate. A high concentration N-type region 15a is formed on the surface of the P-type well 12a, a high concentration N-type region 15b is formed on the surface of the P-type well 12b, and each of them is grounded. Further, a high concentration P-type region 14a is formed, oppositely to the high concentration N-type region 15a, on the surface of the N-type well 11, and a high concentration P-type region 14b is formed, oppositely to the high concentration N-type region 15b, on the surface of the N-type well 11, and each of them is connected to an I/O pad. A high concentration N-type region 13 is formed on the N-type well 11, being interposed between the high concentration P-type region 14a and the high concentration P-type region 14b, and connected to a trigger device. A surge loaded on the I/O pad is released to the ground terminal via the SCR structures on the both sides.

11 Claims, 7 Drawing Sheets

US 7,187,037 B2

ESD PROTECTION DEVICES WITH SCR STRUCTURES FOR SEMICONDUCTOR INTEGRATED CIRCUITS

FIELD OF THE INVENTION

The present invention relates to a semiconductor integrated device and particularly a semiconductor integrated device comprising an ESD protection circuit.

BACKGROUND OF THE INVENTION

A semiconductor integrated circuit (IC) is required to be resistant to surge voltage and surge current caused by electrostatic discharge (ESD) and loaded on the input/output pad of the IC. In order to meet this requirement, an ESD protection circuit is connected to the input/output pad of IC in general. Such an ESD protection circuit is required to have a good discharge ability and low trigger voltage as semiconductor integrated circuits are miniaturized. An example of an ESD protection circuit that meets these requirements is disclosed in Patent-Document 1.

FIG. 4 is a cross-sectional view showing the structure of the main part of a conventional ESD protection circuit. On a P-type semiconductor substrate 100, an N-type well 101 and a P-type well 102, adjacent to the N-type well 101, are formed. Furthermore, on the surface of the N-type well 101, a high concentration N-type region (N+ region) 103 and a high concentration P-type region (P+ region) 104 are formed, and a high concentration N-type region 105 is formed on the surface of the P-type well 102. Element isolation films 106a, 106b, 106c, 106d are isolation films to electrically isolate elements from each other, particularly the element isolation film 106b isolates the high concentration N-type region 103 from the high concentration P-type region 104, and the element isolation film 106c isolates the high concentration N-type region 105 from the high concentration P-type region 104. The high concentration N-type region 103 is connected to a trigger device not shown in the drawing, the high concentration P-type region 104 is connected to an I/O pad also not shown in the drawing, and the high concentration N-type region 105 is grounded.

FIG. 5 is a drawing showing the ESD protection circuit shown in FIG. 4 as an equivalent circuit diagram. Further, FIG. 6 is a layout diagram looking at the ESD protection circuit in FIG. 4 from above. An xy section in FIG. 6 corresponds to FIG. 4. In FIGS. 5 and 6, a PNP transistor Tr1 is comprised of the high concentration P-type region 104, the N-type well 101, and P-type well 102, and an NPN transistor Tr2 is comprised of the N-type well 101, the P-type well 102, and the high concentration N-type region 105. The transistors Tr1 and Tr2 constitute a silicon controlled rectifier (SCR), the high concentration P-type region 104 becomes an anode electrode of the SCR, the high concentration N-type region 105 becomes a cathode electrode of the SCR, and the high concentration N-type region 103 formed on the N-type well 101 becomes a trigger electrode of the SCR.

In this ESD protection circuit, a trigger current Itrig flows from the I/O pad to the trigger device when a voltage higher than a predetermined value is applied to the trigger device. This trigger current acts as a base current of the PNP transistor Tr1, the PNP transistor Tr1 is turned on as a result of the base current flowing, and a collector current flows. When a voltage drop caused by the collector current of the PNP transistor Tr1 occurs in a resistance Rpwell inside the P-type well 102, the base and emitter junction of the NPN transistor Tr2 is forward-biased and the NPN transistor Tr2, too, is turned on. The operation of SCR is achieved by turning on the both transistors Tr1 and Tr2 as described above.

Meanwhile, a structure wherein two systems of SCR are provided in parallel is described in Patent Document 2. FIG. 7 is a drawing showing the layout of the ESD protection device in Patent Document 2. In the ESD protection device shown in FIG. 7, with an N+ region 123 for an N-well potential fixing electrode as the center, N+ regions 124 for a trigger electrode, P+ regions 125 for an anode electrode, and N+ regions 127 for a cathode electrode are formed in order vertically and symmetrically. Outside of these, P+ regions 131 for a P-well potential fixing electrode are provided. P+ regions 125 for the anode electrode, an N-well 121 (the N+ regions 124 for the trigger electrode), a P-well where the P+ regions 131 for the P-well potential fixing electrode are provided, and the N+ regions 127 for the cathode electrode constitute the SCR structure.

[Patent-Document 1] Japanese Patent Kokai Publication No. JP-P2003-203985A (FIG. 2)

[Patent-Document 2] U.S. Patent Publication US2004/0136127A1 (FIG. 18B)

SUMMARY OF THE DISCLOSURE

In the layout diagram of the conventional example shown in FIG. 6, it is experimentally confirmed that, when an ESD current flows, the current density of this ESD current gets higher near a metal wiring leading-out part. For instance, if a metal wiring is led out from the lower part of the diagram in FIG. 6, the ESD current will have a tendency to be unevenly distributed to only the lower part. Therefore, in the example in FIG. 6, even if the unit element size (Wunit in FIG. 6) of the SCR is increased in order to enhance discharge ability, the effect of increasing the unit element size cannot be obtained because of the uneven distribution of the discharge current. Especially when Wunit is longer than 50 μm, this phenomenon is more apparent and the discharge ability of the SCR is no longer proportionate to the Wunit size. On the other hand, when Wunit is shorter than 10 μm, the ESD current does not flow sufficiently and desirable ESD protection characteristics cannot be achieved. As described above, in the conventional example shown in FIGS. 4 to 6, a metal wiring design that prevents the uneven distribution of current density is necessary, restricting the freedom in wiring layout.

In order to prevent the uneven distribution of current density, it is effective to decrease the size of Wunit and have two systems of SCR in a parallel structure as shown in FIG. 7. In the structure of FIG. 7, however, since the N+ region 123 for fixing the N-well potential is provided, the emitter and base junction of the PNP transistor cannot be easily forward-biased and the high speed operation of the PNP transistor cannot be achieved. Therefore, it is difficult for the SCR to operate in association with high speed ESD such as CDM (Charged Device Model). Further, the N-well size 121 has to be increased to accommodate the N+ region 123 for fixing the N-well potential, resulting in the increase in the size of the protection device and the parasitic capacitance of a signal terminal.

In order to solve the above-mentioned problems, the present inventor realized that an ESD protection circuit could operate stably without the N+ region 123 for the N-well fixing electrode in FIG. 7 and that it was possible to remove the N+ region 123 and combine the two N+ regions 124 for the trigger electrode, and achieved the present invention. Hereinafter, the first-conductivity type described in the claims and a first aspect will be called N-type, and the second-conductivity type will be called P-type. However, the order is not limited to this and can be reversed in the present invention.

According to the first aspect of the present invention, there is provided a semiconductor integrated device comprising an electrostatic discharge ESD protection circuit constituted on a semiconductor substrate. The ESD protection circuit comprises a first-conductivity type well formed on the surface of said semiconductor substrate; a first second-conductivity type well and a second second-conductivity type well formed oppositely to each other and adjacent to said first-conductivity type well, with said first-conductivity type well interposed between them, on the surface of said semiconductor substrate; a first high concentration first-conductivity type region formed on the surface of said first second-conductivity type well; a second high concentration first-conductivity type region formed on the surface of said second second-conductivity type well; a first high concentration second-conductivity type region formed oppositely to said first high concentration first-conductivity type region on the surface of said first-conductivity type well; a second high concentration second-conductivity type region formed oppositely to said second high concentration first-conductivity type region on the surface of said first-conductivity type well; a third high concentration first-conductivity type region formed on the surface of said first-conductivity type well and interposed between said first high concentration second-conductivity type region and said second high concentration second-conductivity type region; and a trigger device having two terminals, wherein a current flows when a voltage higher than a predetermined value is applied across said two terminals; said first high concentration second-conductivity type region and said second high concentration second-conductivity type region are connected to an I/O pad; one of the terminals of said trigger device is connected to said third high concentration first-conductivity type region via wiring and the other terminal is connected to a reference voltage terminal; and said first high concentration first-conductivity type region and said second high concentration first-conductivity type region are connected to said reference voltage terminal.

A semiconductor integrated circuit relating to the first aspect of the present invention is a semiconductor integrated device comprising an ESD protection circuit constituted on a semiconductor substrate. The ESD protection circuit comprises an N-type well formed on the surface of the semiconductor substrate, and a first P-type well and a second P-type well formed oppositely to each other and adjacent to the N-type well, with the N-type well interposed between them, on the surface of the semiconductor substrate. It further comprises a first high concentration N-type region formed on the surface of the first P-type well, a second high concentration N-type region formed on the surface of the second P-type well, a first high concentration P-type region formed oppositely to the first high concentration N-type region on the surface of the N-type well, a second high concentration P-type region formed oppositely to the second high concentration N-type region on the surface of the N-type well, and a third high concentration N-type region formed on the surface of the N-type well and interposed between the first high concentration P-type region and the second high concentration P-type region. It further comprises a trigger device having two terminals, in which a current flows when a voltage higher than a predetermined value is applied between the two terminals. The first high concentration P-type region and the second high concentration P-type region are connected to an I/O pad. One of the terminals of the trigger device is connected to the third high concentration N-type region via wiring and the other terminal is connected to a reference voltage terminal. The first high concentration N-type region and the second high concentration N-type region are connected to the reference voltage terminal.

In the ESD protection circuit structured as described above, the N+ region for the N-well fixing electrode in the conventional example is removed, the two N+ regions 124 for the trigger electrode are combined into one region, and two SCR structures are formed symmetrically with the third high concentration N-type region, the combined region, interposed between them. A surge loaded on the I/O pad is released to the reference voltage terminal via the two SCR structures.

The meritorious effects of the present invention are summarized as follows.

According to the present invention, the uneven distribution of ESD current does not occur in the SCR part, achieving the uniform operation of SCR. Therefore, the unit element size (Wunit) can be reduced without hurting discharge ability, achieving the reduction of the element area and the parasitic capacitance.

PREFERRED EMBODIMENTS OF THE INVENTION

Figure 1:
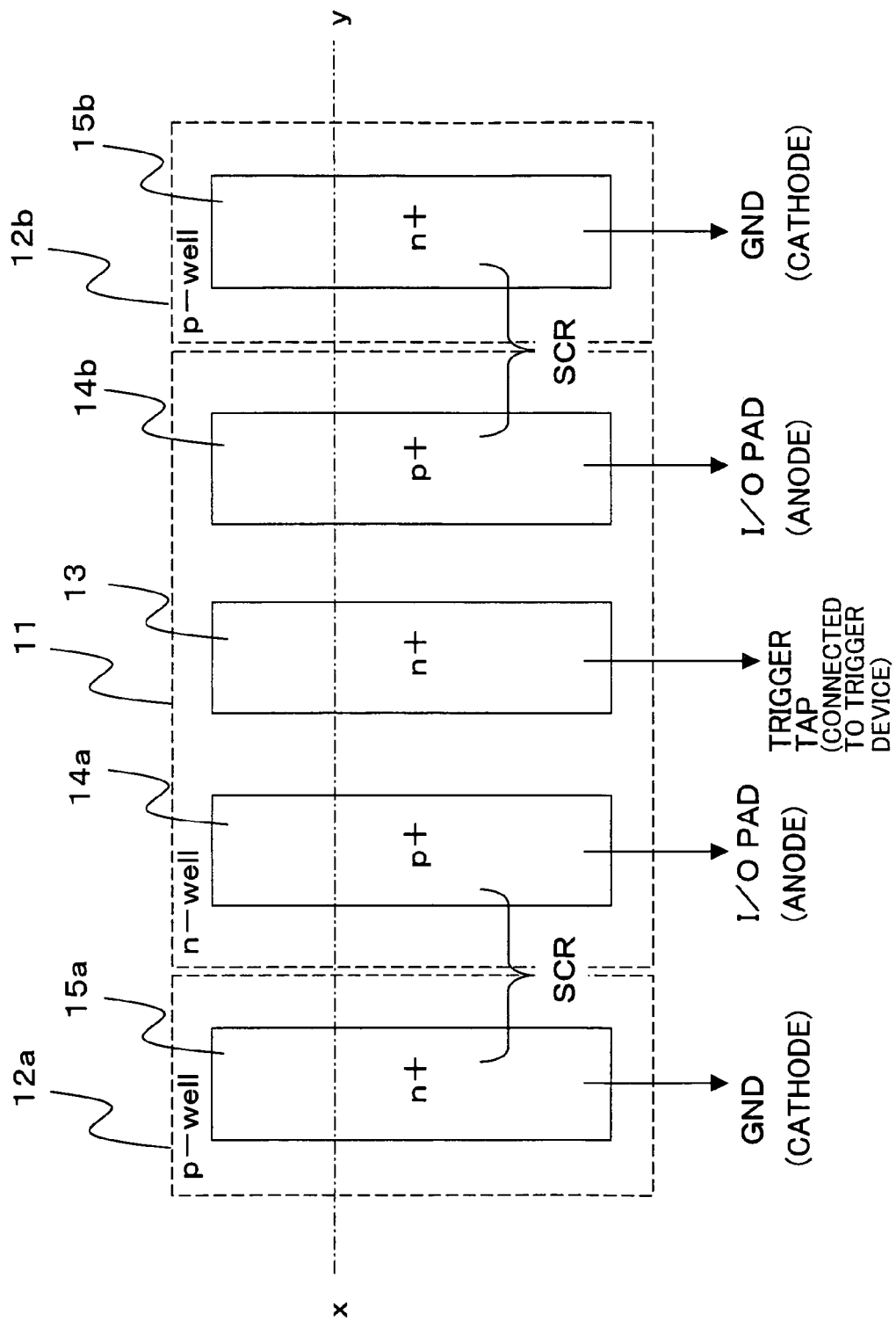
FIG. 1 is a layout diagram looking at the main part of a semiconductor integrated device relating to an embodiment of the present invention from above.

FIG. 1 is a layout diagram looking at an ESD protection circuit part, the main part of a semiconductor integrated device relating to an embodiment of the present invention from above. In FIG. 1, an N-type well 11, and P-type wells 12a and 12b disposed oppositely to each other and adjacent to the N-type well 11, with the N-type well 11 interposed between them, are formed on the surface of a semiconductor substrate. And a high concentration N-type region 15a is formed on the surface of the P-type well 12a, and a high concentration N-type region 15b is formed on the surface of the P-type well 12b. Further, a high concentration P-type region 14a is formed, oppositely to the high concentration N-type region 15a, on the surface of the N-type well 11, and a high concentration P-type region 14b is formed, oppositely to the high concentration N-type region 15b, on the surface of the N-type well 11. A high concentration N-type region 13 is formed on the N-type well 11, being interposed between the high concentration P-type region 14a and the high concentration P-type region 14b.

In the ESD protection circuit with such a structure, the high concentration P-type regions 14a and 14b are connected in common to the I/O pad. Further, one of two terminals of a trigger device in which a current flows when a voltage higher than a predetermined value is applied between the two terminals is connected to the high concentration N-type region 13 via wiring. The high concentration N-type regions 15a and 15b are connected to a reference voltage terminal such as a ground terminal. The fixed electrode of the N-type well 11 in the conventional example is not necessary. As the trigger device, conventionally known elements such as a MOS transistor or diode can be used (refer to Patent Documents 1 and 2).

Figure 2:
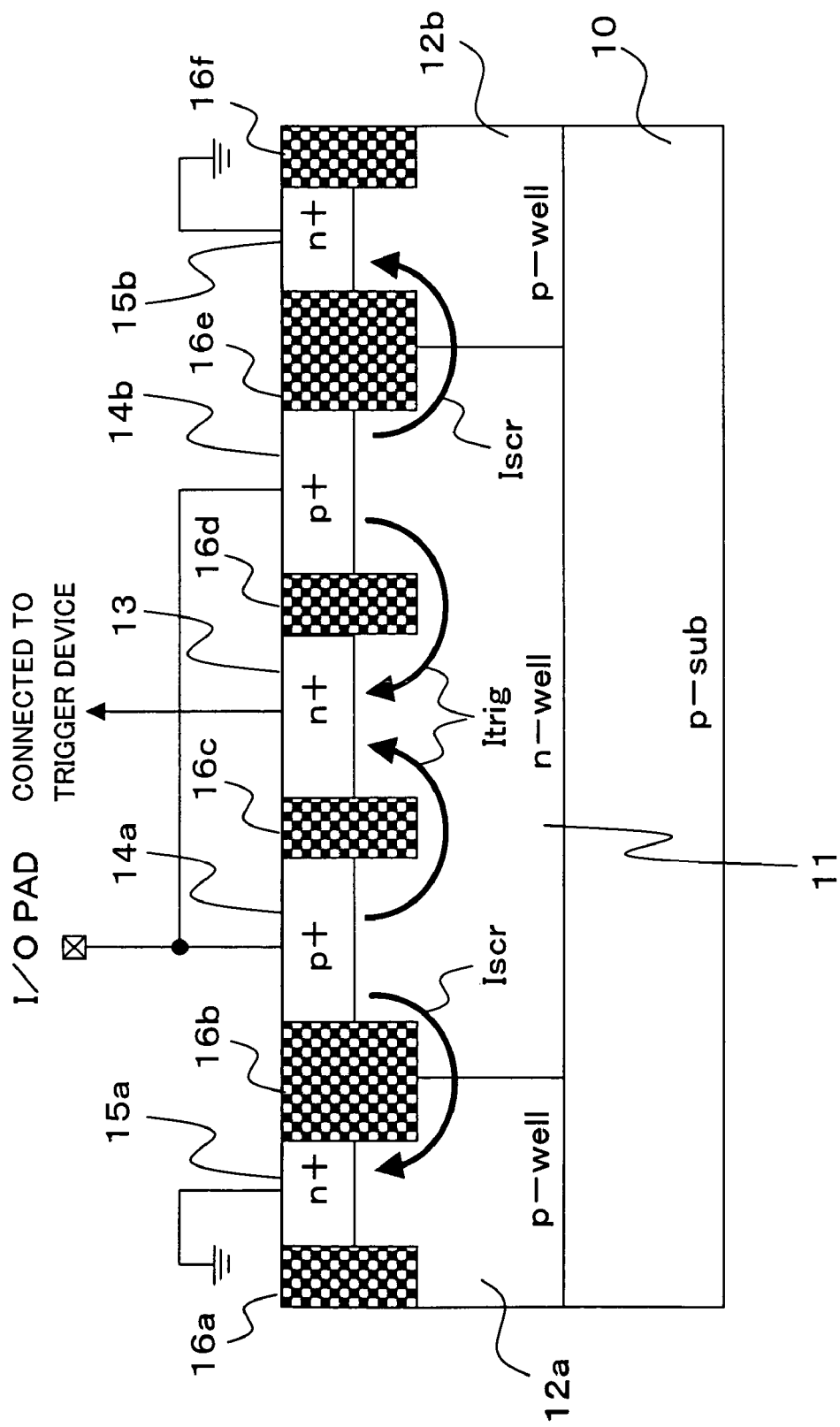
FIG. 2 is a cross-sectional view showing the structure of the main part of the semiconductor integrated device relating to the embodiment of the present invention.

FIG. 2 is a cross-sectional view at an xy section in FIG. 1 showing the structure of the main part of the semiconductor integrated device relating to the embodiment of the present invention. In FIG. 2, the N-type well 11, and the P-type wells 12a and 12b disposed oppositely to each other and adjacent to the N-type well 11, with the N-type well 11 interposed between them, are formed on the P-type semiconductor substrate 10. On these wells, an SCR structure is formed horizontally and symmetrically with the high concentration N-type region 13, which a trigger electrode is connected to, in the center. The symmetrical SCR structure is comprised of the high concentration P-type region 14a (14b), which corresponds to an anode electrode, the high concentration N-type region 13 and the N-type well 11, which correspond to the trigger electrode, the P-type well 12a (12b), and the high concentration N-type region 15a (15b), which corresponds to a cathode electrode. Further, element isolation films 16a, 16b, 16c, 16d, 16e, and 16f electrically isolate the high concentration N-type region 15a from an outside region not shown in the drawing, the high concentration N-type region 15a from the high concentration P-type region 14a, the high concentration P-type region 14a from the high concentration N-type region 13, the high concentration N-type region 13 from the high concentration P-type region 14b, the high concentration P-type region 14b from the high concentration N-type region 15b, and the high concentration N-type region 15b from an outside region not shown in the drawing respectively.

In such a SCR structure, a trigger current Itrig flows from the I/O pad to the trigger device when a voltage higher than a predetermined value is applied to the trigger device. Because of the trigger current Itrig, the high concentration P-type region 14a (14b), the N-type well 11, and the P-type well 12a (12b), which correspond to a PNP transistor, operate. As a result, the both sides of the symmetrical SCR structure are activated, and an SCR current Iscr flows from the I/O pad to the ground terminal connected to the cathode electrode. Because of the SCR current Iscr, the surge loaded on the I/O pad is released to the ground terminal with a low resistance, without damaging the internal circuit.

As described above, the SCR of the ESD protection circuit relating to the embodiment of the present invention has a horizontally symmetrical structure with the high concentration N-type region 13, to which the trigger electrode is connected, as the center. By reducing the unit element size of the SCR and having the trigger current Itrig and the SCR current Iscr flow in the both sides of the SCR structure, the uneven distribution of current density can be minimized and the area of the ESD protection circuit can be reduced.

EXAMPLE

Figure 3A:
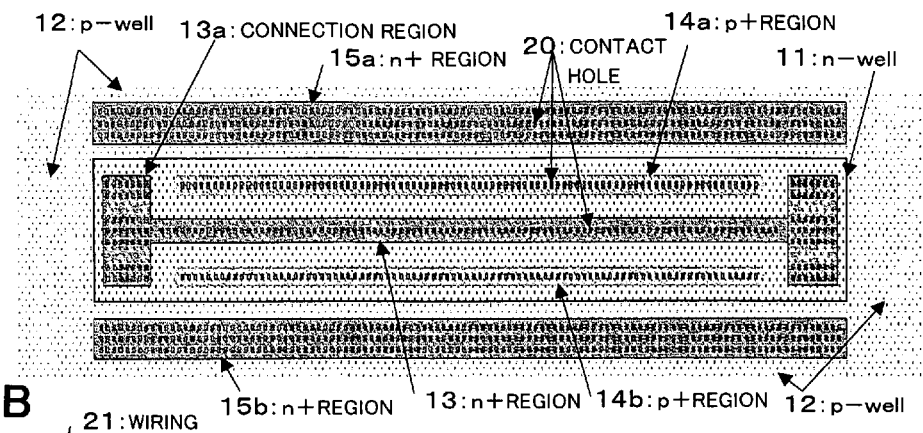
FIGS. 3A, 3B and 3C are layout diagrams showing each layer of an ESD protection circuit relating to the embodiment of the present invention.
Figure 3B:
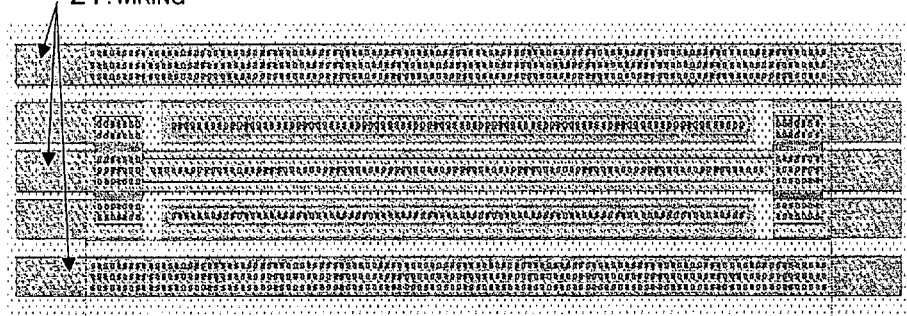
Figure 3C:
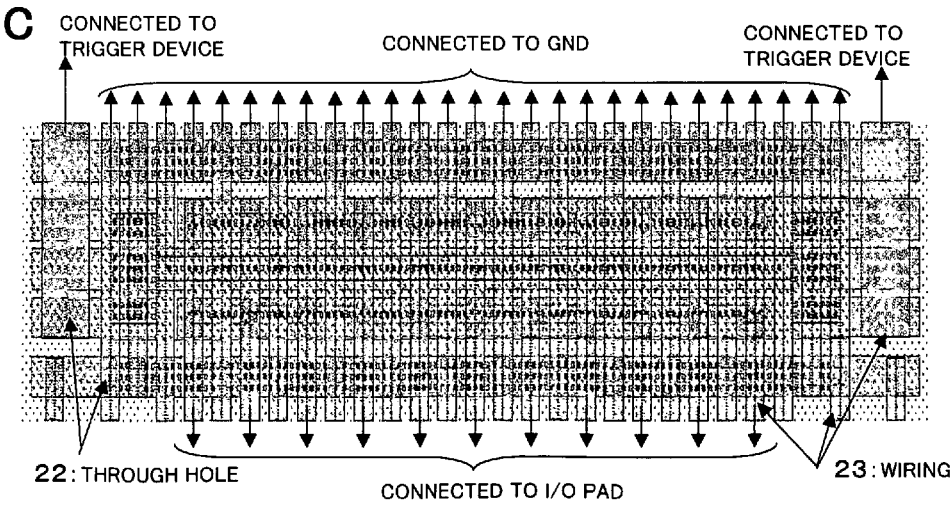
Figure 4:
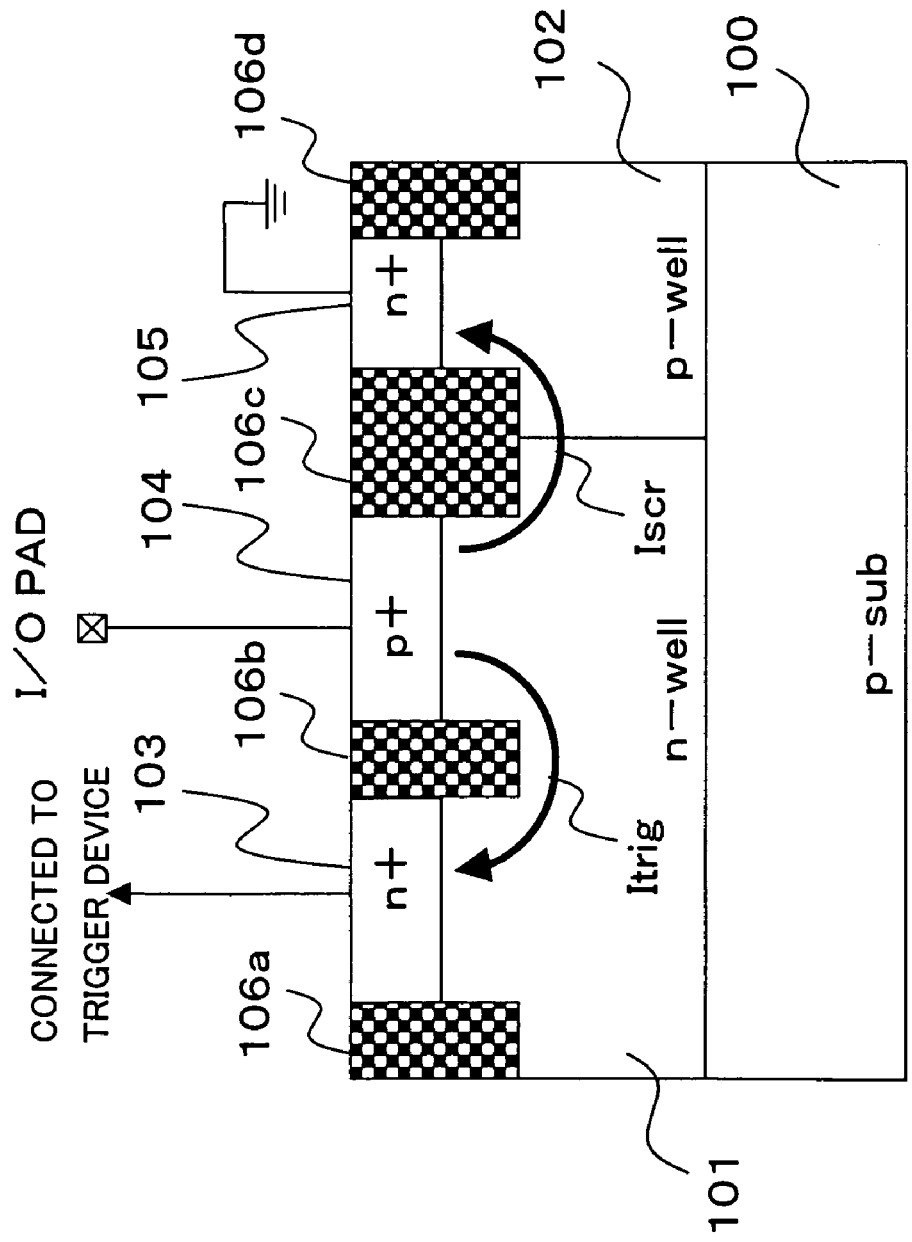
FIG. 4 is a cross-sectional view showing the structure of the main part of a conventional ESD protection circuit.
Figure 5:
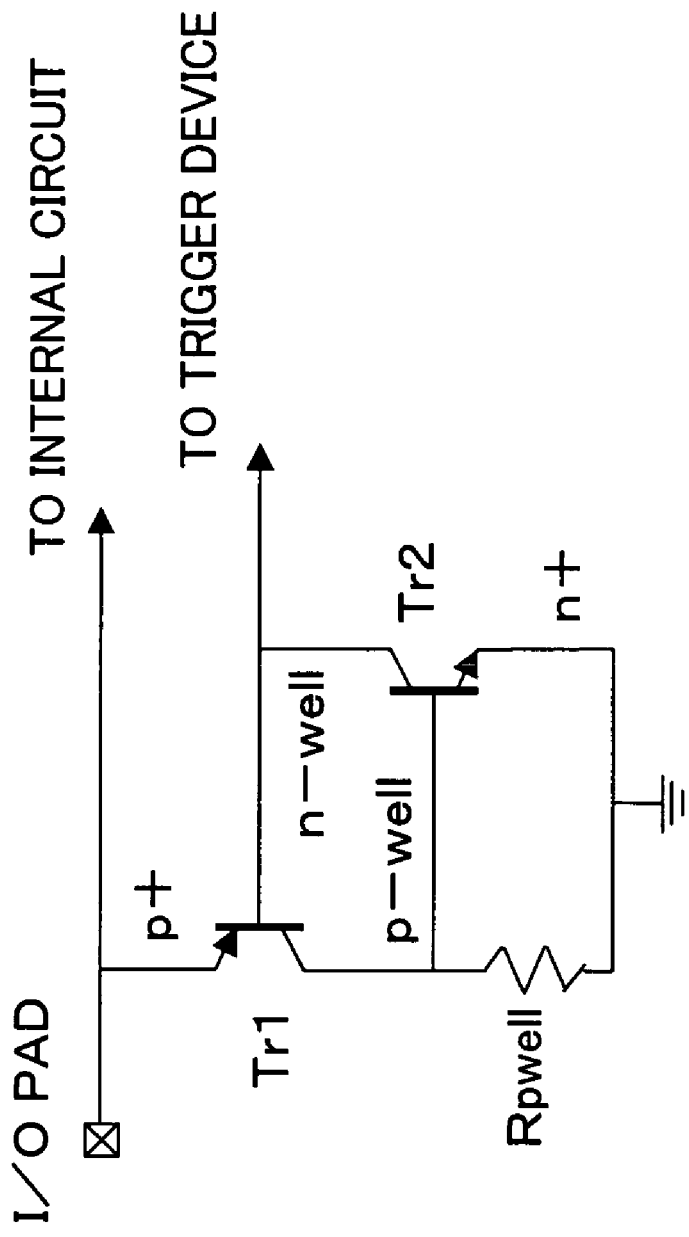
FIG. 5 is a drawing showing the conventional ESD protection circuit as an equivalent circuit diagram.
Figure 6:
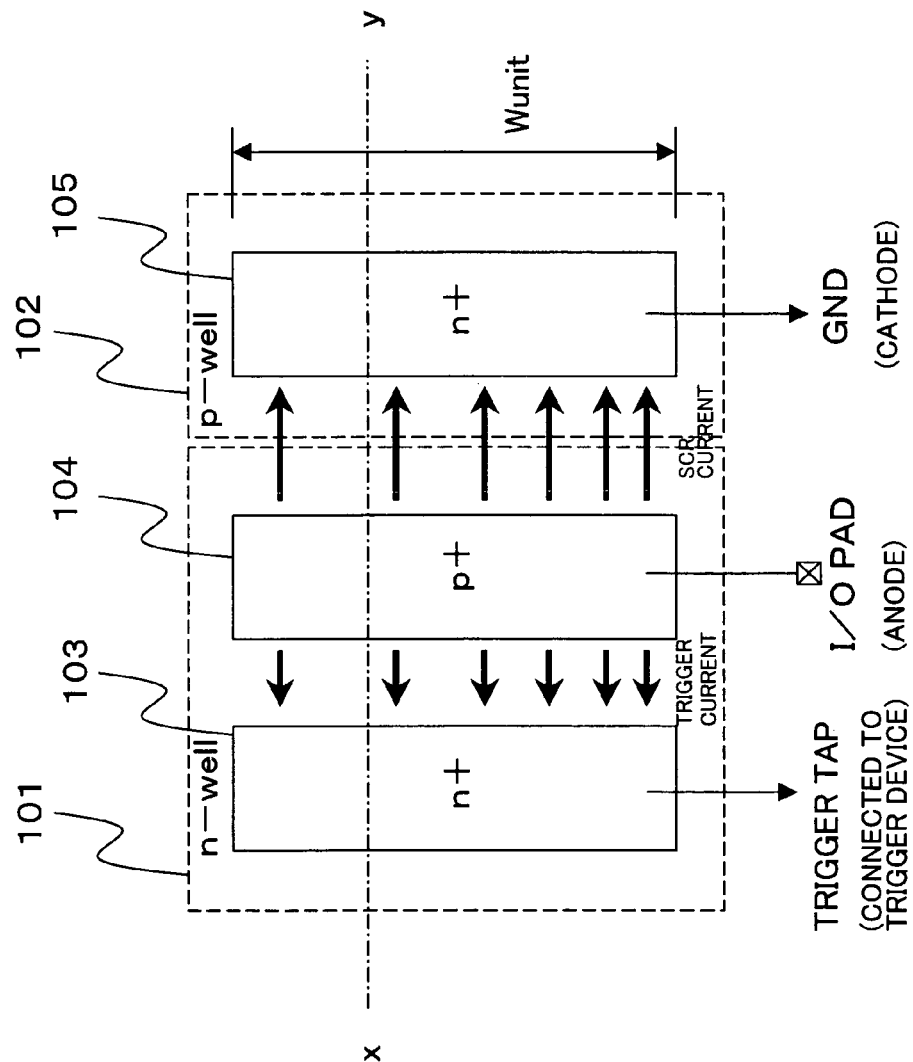
FIG. 6 is a layout diagram looking at the conventional ESD protection circuit from above.
Figure 7:
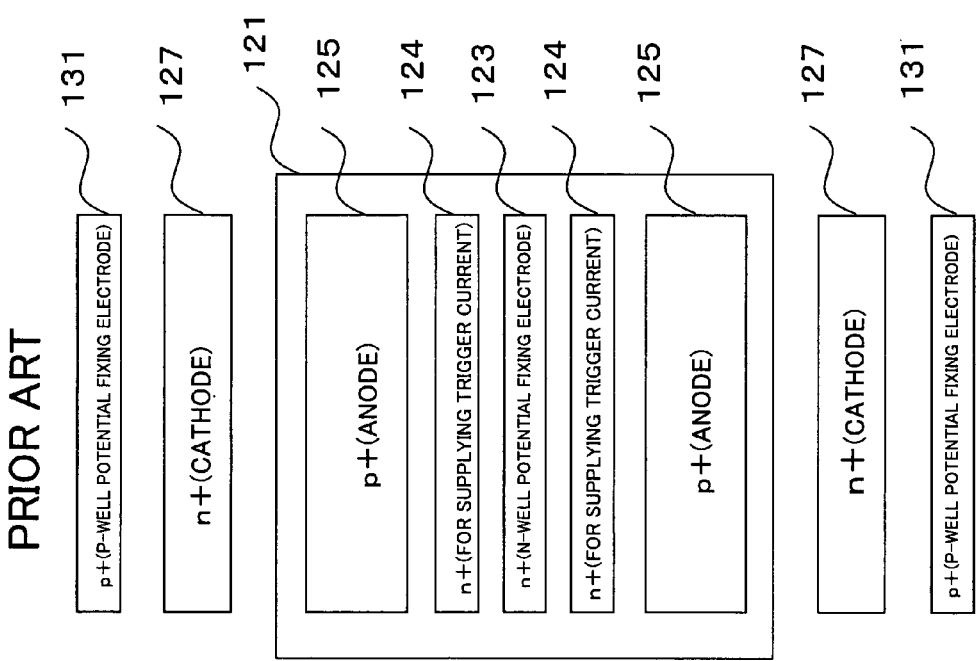
FIG. 7 is a drawing showing the layout of the ESD protection device in Patent Document 2.

FIGS. 3A, 3B and 3C are layout diagrams showing each layer of the ESD protection circuit relating to an example of the present invention. FIG. 3A is a layout diagram corresponding to FIG. 1, and the rectangular N-type well 11 is formed in the center with the P-type wells 12 surrounding it. In the center of the N-type well 11, the rectangular high concentration N-type (N+) region 13, to which the trigger electrode is connected, is formed, and the rectangular high concentration P-type (P+) regions 14a and 14b, to which the anode electrode is connected, are formed symmetrically above and beneath this high concentration N-type region 13. Further, facing the high concentration P-type regions 14a and 14b, to which the anode electrode is connected, the rectangular high concentration N-type (N+) regions 15a and 15b, to which the cathode electrodes are connected respectively, are formed on the P-well 12. The high concentration N-type region 13, and the high concentration P-type regions 14a and 14b are rectangles with a width of approximately 0.4 to 0.5 µm and a length of 10 to 50 µm, preferably about 20 to 30 µm, the high concentration N-type regions 15a and 15b are rectangles with a width of approximately 1 µm and a length of 10 to 50 µm, preferably about 20 to 30 µm, are parallel to each other in the long direction, and have approximately the same length. The length of each rectangle can be changed according to layout needs as long as it does not lose its function, for instance, connection regions 13a for the trigger device are provided at the both ends of the high concentration N-type region 13, to which the trigger device is connected, in the long direction. Further, numerous contact holes 20 are provided above the high concentration N-type region 13 (including the connection regions 13a), the high concentration P-type regions 14a and 14b, and the high concentration N-type regions 15a and 15b in order to connect these regions to wiring layers provided above these holes.

FIG. 3B is a layout diagram of a first metal wiring layer provided above the layer shown in FIG. 3A with an insulator interposed between them. Each wiring 21 shown in FIG. 3B is connected to each region in FIG. 3A via the contact hole 20, and is wired horizontally. Especially from the connection regions 13a provided at the both ends of the high concentration N-type region 13, three wirings are drawn out from each side.

FIG. 3C is a layout diagram of a second metal wiring layer provided above the first metal wiring layer shown in FIG. 3B with an insulator interposed between them. Wirings 23 in FIG. 3C are connected to the wirings 21 in FIG. 3B via through holes 22, and are disposed vertically i.e., in the direction perpendicular to the long direction of each region of the semiconductor. For instance, at the bottom of FIG. 3C, the high concentration P-type regions 14a and 14b are wired with numerous wires and connected to the I/O pad not shown in the figures. Further, the high concentration N-type regions 15a and 15b are wired with numerous wires at the top of FIG. 3C and connected to the ground terminal (GND). Furthermore, corresponding to the connection regions 13a on the both sides, the high concentration N-type region 13 is wired vertically at the both ends of FIG. 3C and connected to the trigger device not shown in the figures. As described above, the connection regions 13a can be wired to the trigger device without disturbing the wiring connected to the I/O pad and the wiring connected to the ground terminal.

In the ESD protection circuit with the layout as described above, a surge current loaded on the I/O pad is released to the ground terminal (GND) via the numerous wires within the first and second metal wiring layers and the two upper and lower SCR structures inside the ESD protection circuit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated device comprising an electrostatic discharge ESD protection circuit constituted on a semiconductor substrate, wherein said ESD protection circuit comprises:
a first-conductivity type well formed on a surface of said semiconductor substrate;
a first second-conductivity type well and a second second-conductivity type well formed oppositely to each other and adjacent to said first-conductivity type well, with said first-conductivity type well interposed between them, on the surface of said semiconductor substrate;
a first high concentration first-conductivity type region formed on the surface of said first second-conductivity type well;
a second high concentration first-conductivity type region formed on the surface of said second second-conductivity type well;
a first high concentration second-conductivity type region formed oppositely to said first high concentration first-conductivity type region on the surface of said first-conductivity type well;
a second high concentration second-conductivity type region formed oppositely to said second high concentration first-conductivity type region on the surface of said first-conductivity type well;
a third high concentration first-conductivity type region formed on the surface of said first-conductivity type well and interposed between said first high concentration second-conductivity type region and said second high concentration second-conductivity type region; and
a trigger device having two terminals, wherein a current flows when a voltage higher than a predetermined value is applied across said two terminals;
said first high concentration second-conductivity type region and said second high concentration second-conductivity type region are connected to an I/O pad;
one of the terminals of said trigger device is connected to said third high concentration first-conductivity type region via wiring and the other terminal is connected to a reference voltage terminal; and
said first high concentration first-conductivity type region and said second high concentration first-conductivity type region are connected to said reference voltage terminal.

2. The semiconductor integrated device as defined in claim 1 wherein only said third high concentration first-conductivity type region exists between said first high concentration second-conductivity type region and said second high concentration second-conductivity type region on said first-conductivity type well.

3. The semiconductor integrated device as defined in claim 1 wherein the shape of said first high concentration first-conductivity type region, said second high concentration first-conductivity type region, said first high concentration second-conductivity type region, and said second high concentration second-conductivity type region is rectangular looking from the direction perpendicular to the surface of said semiconductor substrate, and the rectangles are parallel to each other in the long direction.

4. The semiconductor integrated device as defined in claim 3 wherein said rectangles have approximately the same length in the long direction.

5. The semiconductor integrated device as defined in claim 4 wherein said length in the long direction is 10 μm to 50 μm.

6. The semiconductor integrated device as defined in claim 3 wherein said third high concentration first-conductivity type region is formed so that the long direction of said third high concentration first-conductivity type region is parallel to the long direction of said rectangles.

7. The semiconductor integrated device as defined in claim 6 wherein connection regions for wiring one of said trigger device are provided the both ends of said third high concentration first-conductivity type region in the long direction.

8. The semiconductor integrated device as defined in claim 1 wherein, with said third high concentration first-conductivity type region as a center, said first high concentration second-conductivity type region is structured symmetrically to said second high concentration second-conductivity type region, and said first high concentration first-conductivity type region is structured symmetrically to said second high concentration first-conductivity type region.

9. The semiconductor integrated device as defined in claim 1 wherein said first second-conductivity type well and said second second-conductivity type well are formed commonly surrounding said first-conductivity type well.

10. The semiconductor integrated device as defined in claim 1 wherein said first high concentration first-conductivity type region, said second high concentration first-conductivity type region, said first high concentration second-conductivity type region, said second high concentration second-conductivity type region, and said third high concentration first-conductivity type region are connected to a first wiring group within a first metal wiring layer formed above the surface of said semiconductor substrate, with an insulator interposed between them, via a plurality of contact holes, respectively,
said first wiring group is connected to a second wiring group within a second metal wiring layer formed above said first metal wiring layer, with another insulator interposed between them, via a plurality of through holes, and wirings included in said second wiring group are wired in the direction perpendicular to said long direction at connection points of said through holes.

11. The semiconductor integrated device as defined in claim 10 wherein a third wiring group included in said second wiring group connected to said first high concentration first-conductivity type region, said second high concentration first-conductivity type region, said first high concentration second-conductivity type region, and said second high concentration second-conductivity type region is provided in a region above said first high concentration first-conductivity type region, said second high concentration first-conductivity type region, said first high concentration second-conductivity type region, and said second high concentration second-conductivity type region, and
wirings included in said second wiring group connected to said third high concentration first-conductivity type region are disposed at least one of the both ends of said third wiring group.

* * * * *